(12) United States Patent
Xiao (10) Patent No.: US 10,865,477 B2
(45) Date of Patent: Dec. 15, 2020

(54) METHOD AND SYSTEM FOR THE LOCALIZED DEPOSIT OF METAL ON A SURFACE

(71) Applicant: Illinois Tool Works Inc, Glenview, IL (US)

(72) Inventor: Zhigang Xiao, Washington Township, OH (US)

(73) Assignee: Illinois Tool Works Inc., Glenview, IL (US)

(*) Notice: Subject to any disclaimer, the term of this patent is extended or adjusted under 35 U.S.C. 154(b) by 0 days.

(21) Appl. No.: 15/018,148

(22) Filed: Feb. 8, 2016

(65) Prior Publication Data

US 2017/0226636 A1   Aug. 10, 2017

(51) Int. Cl.
| | | |
|---|---|---|
| *C23C 16/455* | (2006.01) | |
| *C23C 16/14* | (2006.01) | |
| *C23C 16/04* | (2006.01) | |
| *H01L 21/285* | (2006.01) | |

(52) U.S. Cl.
CPC .......... *C23C 16/455* (2013.01); *C23C 16/047* (2013.01); *C23C 16/14* (2013.01); *C23C 16/45514* (2013.01); *H01L 21/28562* (2013.01)

(58) Field of Classification Search
CPC ....... C23C 16/16; C23C 16/486; C23C 16/56; C23C 16/54; C23C 16/402; C23C 16/455; C23C 16/45561; C23C 16/45563; C23C 14/562; C23C 16/34; C23C 16/405; C23C 16/448; C23C 16/45521; C23C 16/45565; C23C 16/5096; C23C 16/52; H01J 31/127; H01J 9/44

USPC ............ 427/248.1; 257/E21.274, E21.002, 257/E21.24, E21.282, E21.478, E29.002, 257/629; 438/680, 694, 697, 699, 761, 438/763, 770, 785, 790

See application file for complete search history.

(56) References Cited

U.S. PATENT DOCUMENTS

| | | | |
|---|---|---|---|
| 4,799,454 A | * | 1/1989 | Ito .................... C23C 14/221 118/723 CB |
| 4,933,207 A | | 6/1990 | Jensen et al. |
| 4,957,775 A | | 9/1990 | Black |
| 4,980,198 A | | 12/1990 | Dowben et al. |

(Continued)

FOREIGN PATENT DOCUMENTS

| | | |
|---|---|---|
| CN | 1752279 | 3/2006 |
| CN | 105695951 | 6/2016 |

(Continued)

*Primary Examiner* — Edward Chin
(74) *Attorney, Agent, or Firm* — McAndrews, Held & Malloy, Ltd.

(57) ABSTRACT

The present disclosure is directed to a method and system for the localized deposition of a metal layer on a surface. The method involves introducing at least two gaseous reactants to a substrate surface that is locally heated by a laser. The surface is heated to a temperature at which the gaseous reactants undergo a reaction that results in metal crystal growth on the substrate surface. The reaction is maintained for a desired period of time and under desired conditions to produce a localized deposit of a metal layer on the heated zone of the substrate. In some embodiments, the gas outlets and the laser may be moved in a controlled manner so that a metal layer may be deposited in a desired pattern on the substrate surface.

20 Claims, 3 Drawing Sheets

(56) References Cited

U.S. PATENT DOCUMENTS

| | | | |
|---|---|---|---|
| 4,987,855 A | 1/1991 | Ahlgren | |
| 5,060,595 A | 10/1991 | Ziv et al. | |
| 5,104,684 A * | 4/1992 | Tao | C23C 16/047 118/723 FI |
| 5,164,222 A | 11/1992 | Gottsleben | |
| 5,307,775 A | 5/1994 | Ruthardt | |
| 5,805,971 A * | 9/1998 | Akedo | B22F 3/115 419/6 |
| 6,926,920 B2 | 8/2005 | Jang et al. | |
| 7,019,402 B2 | 3/2006 | Andry et al. | |
| 7,439,180 B2 | 10/2008 | Guha et al. | |
| 7,807,573 B2 | 10/2010 | Li et al. | |
| 8,105,954 B2 | 1/2012 | Wang et al. | |
| 8,580,130 B2 * | 11/2013 | Mao | C23C 16/047 216/65 |
| 2002/0190035 A1 * | 12/2002 | Giacobbe | B23K 26/0648 219/121.12 |
| 2003/0161970 A1 * | 8/2003 | Kaito | B82Y 30/00 427/595 |
| 2004/0016403 A1 | 1/2004 | Gavish | |
| 2005/0082676 A1 * | 4/2005 | Andry | H01L 21/76898 257/763 |
| 2006/0051508 A1 * | 3/2006 | Gavish | C23C 16/16 427/248.1 |
| 2006/0112876 A1 | 6/2006 | Choi et al. | |
| 2008/0073127 A1 * | 3/2008 | Zhan | B24D 3/02 175/434 |
| 2009/0297802 A1 * | 12/2009 | Sastry | C23C 18/165 428/209 |
| 2010/0102700 A1 * | 4/2010 | Jaiswal | C01G 41/00 313/311 |
| 2011/0070381 A1 * | 3/2011 | Toth | C23C 14/548 427/585 |
| 2012/0288978 A1 * | 11/2012 | Sugiyo | H01G 9/2031 438/57 |
| 2013/0122771 A1 * | 5/2013 | Matsubara | B01D 39/163 442/351 |
| 2013/0217177 A1 * | 8/2013 | Wong | C23C 16/306 438/95 |
| 2014/0302255 A1 * | 10/2014 | Spicer | C23C 16/045 427/554 |
| 2015/0209826 A1 * | 7/2015 | Bordia | C23C 18/1208 428/195.1 |
| 2016/0340783 A1 * | 11/2016 | Lu | C22C 11/00 |
| 2017/0037518 A1 * | 2/2017 | Oxford | C23C 24/103 |

FOREIGN PATENT DOCUMENTS

| | | | |
|---|---|---|---|
| CN | 205603669 | 9/2016 | |
| GB | 2212819 | 8/1989 | |
| WO | WO-2016186299 A1 * | 11/2016 | C23C 16/4408 |

* cited by examiner

METHOD AND SYSTEM FOR THE LOCALIZED DEPOSIT OF METAL ON A SURFACE

BACKGROUND OF THE INVENTION

The present disclosure is directed toward methods and systems for the printing of a substrate with a metal surface layer.

The use of chemical vapor deposition processes for the coating of a substrate with a metal is known in the art. In a conventional chemical vapor deposition process, a substrate is heated and the reactants are introduced across that substrate, resulting in the deposition of a metal layer across the entirety of the substrate. If less than the entirety of a substrate is to be coated, complex patterning or overlaying procedures are required.

The present disclosure provides improved methods and systems for the deposit of a metal surface layer. By restricting the reactants to a relatively small space and performing the reaction on a limited portion of the substrate, the methods and systems described herein provide for a localized deposit of a metal surface coating on a controlled portion of a substrate, as opposed to the less constrained conventional deposition process. The methods and systems of the present disclosure also do not require any additional patterning or overlaying steps to obtain a metal layer having a specific configuration. Moreover, by introducing the reactants locally to the portion of the substrate on which the metal is deposited, the methods and systems described herein provide for a significant reduction in the amount of reactants needed to prepare a metal surface layer.

SUMMARY OF THE INVENTION

Embodiments of the present disclosure are directed to a method for the localized deposition of a metal layer on a surface. The method involves introducing at least two reactants, each of the reactants in a gaseous state, to a surface of a substrate. One of the gaseous reactants comprises a metal-containing precursor compound. Another of the gaseous reactants comprises a compound that is capable of reacting with the metal-containing precursor to produce metal crystal growth on a heated surface. These first and second gaseous reactants are introduced to the substrate surface through one or more gas outlets, which are located near the substrate surface. As the first and second gaseous reactants are introduced to the substrate surface, a laser is directed against a location on the substrate surface that is adjacent to the one or more gas outlets. The laser is configured and positioned to heat a zone of the substrate surface to a temperature at which the first and second gaseous reactants undergo a reaction that results in metal crystal growth on the heated zone of the substrate surface. The reaction is maintained for a desired period of time (and under desired conditions) to produce a localized deposit of a metal layer on the heated zone.

In some embodiments, each of (a) the one or more gas outlets and (b) the laser may be moved in a controlled manner so that a metal layer may be deposited in a desired pattern on the substrate surface. The area of the heated zone on the substrate surface may be altered by changing one or more of the laser variables (e.g. beam size, power, positioning, etc.). Accordingly, in some embodiments the metal layer may be patterned such that one section of a continuous deposit might cover a greater portion of the surface, i.e. have a larger width, and another section of the deposit might cover a lesser portion of the surface, i.e. have a smaller width. Similarly, the thickness of the metal layer may be altered by changing one of more of the reaction conditions (e.g. temperature, reactant flowrate, reaction time, etc.). Accordingly, in some embodiments the metal layer may be patterned such that one section of a continuous deposit might have a greater thickness and another section of the deposit might have a lesser thickness. In some embodiments, a consistent continuous deposit may be obtained by controlling the movement of the gas outlets and laser such that the reaction conditions remain substantially consistent across different sections of the deposit.

In some embodiments, the presently disclosed method may be directed toward the controlled deposit of a transition metal, such as tungsten, to a substrate surface by reacting a halogenated metal-containing precursor gas, such as tungsten hexafluoride or tungsten hexachloride, with hydrogen gas at conditions which produce a localized deposit of the transition metal, e.g. tungsten, on a heated zone of the surface. Further, by selecting a proper substrate material and properly controlling the reaction conditions, the metal may be caused to form as a single crystal. If desired, the single crystal material, e.g. monocrystalline tungsten, can then be separated from the substrate using conventional methods.

Embodiments of the present disclosure are also directed to a system for the localized deposition of a metal on a substrate. The system includes one or more gas outlets that are positioned adjacent to a portion of a substrate surface. The one or more gas outlets are in fluid communication with a source of a first gaseous reactant and a source of a second gaseous reactant. The system also includes at least one laser. The laser is positioned to direct its output against a portion of the substrate surface that is adjacent to the one or more gas outlets. The laser is configured to heat a zone of the surface to a desired temperature range. In some embodiments, both (a) the one or more gas outlets and (b) the laser are configured to travel along the substrate surface in a controlled manner, such that the system may provide for the continuous (or interrupted) deposit of a metal layer in a desired pattern on the substrate surface.

The presently disclosed method and system may find particular application in a variety of contexts. For example, embodiments of the presently disclosed method and system may be useful for the manufacture of a variety of electronic components on a surface, such as on the surface of a silicon wafer. Embodiments of the presently disclosed method and system may also be useful for the growth of monocrystalline metal structures, such as monocrystalline tungsten which is used in space travel. And embodiments of the presently disclosed method and system may be used for the localized deposit of metal layers in a precise pattern on a variety of substrates.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

A clear conception of the advantages and features of one or more embodiments will become more readily apparent by reference to the exemplary, and therefore non-limiting, embodiments illustrated in the drawings.

DETAILED DESCRIPTION OF THE INVENTION

Reference will now be made in detail to certain embodiment(s), examples of which are illustrated in the accompanying drawings. Whenever possible, the same reference numerals will be used throughout the drawings to refer to the same or like parts. Embodiments of the present disclosure are directed to a system and process for the localized deposit of a metal layer on substrate.

Systems

Figure 1:
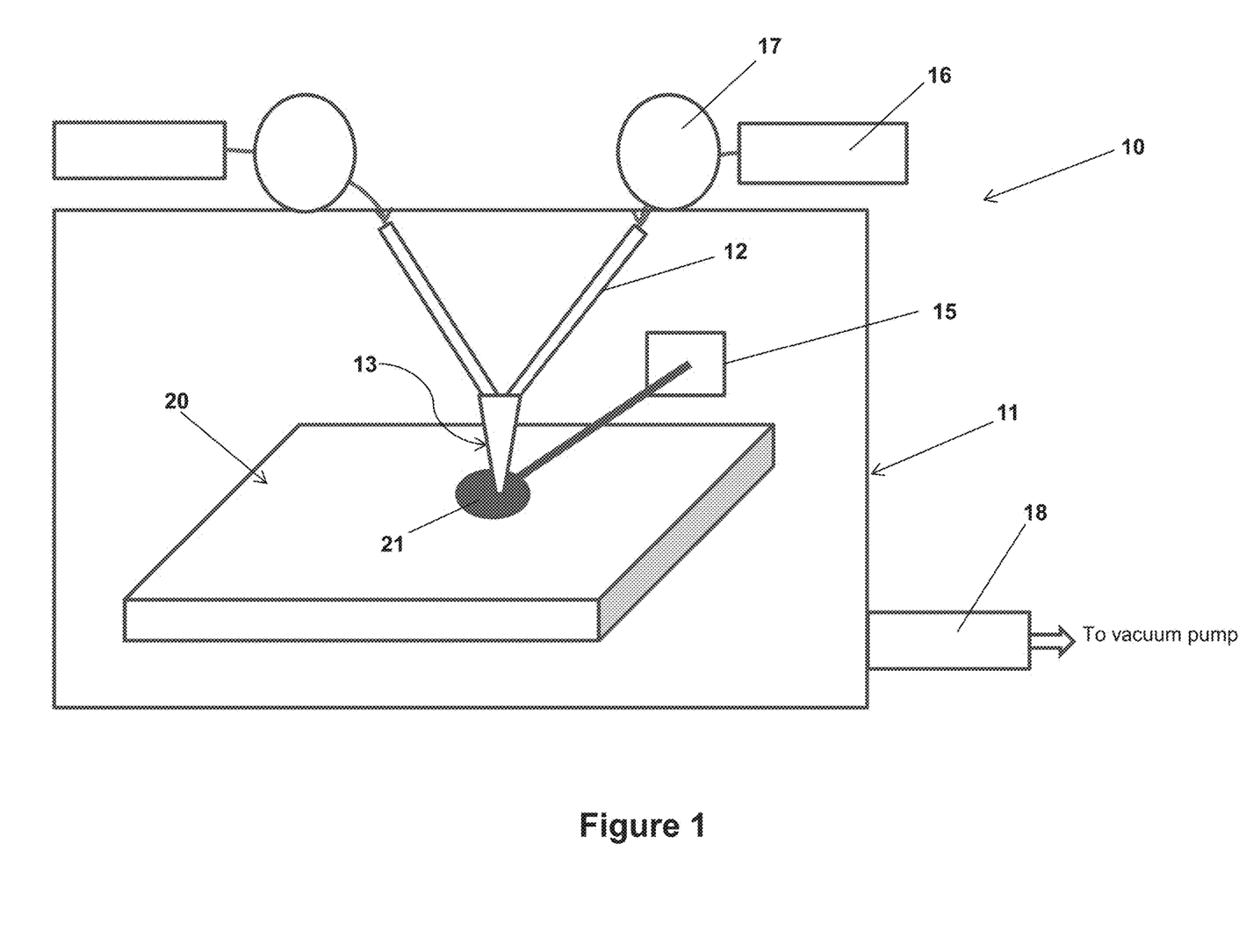
FIG. 1 is an illustration of a system for printing a metal layer on a substrate according to an embodiment of the present disclosure.

An embodiment of the system 10 of the present disclosure is illustrated in FIG. 1. The system shown in FIG. 1 comprises a vacuum chamber 11. The vacuum chamber 11 is configured to maintain a vacuum within the chamber. A mechanical vacuum pump is generally sufficient for most applications. In some applications, however, a high vacuum state may be desirable. A substrate 20, on which a metal layer is to be printed, is positioned within the vacuum chamber 11. As such, the vacuum chamber 11 may contain a substrate holder. If it is desirable that more than one substrate 20 is to be coated within the vacuum chamber 11, the vacuum chamber may comprise a plurality of substrate holders.

The system also comprises one or more gas lines 12 for conveying at least a first gaseous reactant and a second gaseous reactant to one or more gas outlets 13. The one or more gas lines 12 may comprise pipes, tubes, or the like, which are generally understood to be useful in the conveyance of gases. In the embodiments illustrated in the Figures, the first and second gaseous reactants are shown as being conveyed to the one or more gas outlets 13 in separate gas lines 12. Although the separate gas lines 12 are shown as being unconnected from one another, it may often be desirable that the separate gas lines are linked. For instance, the separate gas lines 12 may be connected in a side-by-side relationship, twisted together, in a concentric relationship (i.e. one gas line may be contained within another), etc. In other (non-illustrated) embodiments, a mixture of the first and second gaseous reactants may be conveyed to one or more gas outlets 13 through a single gas line 12.

Each of the one or more gas lines 12 is in fluid communication with at least one source of a gaseous reactant 16. For instance, where separate gas lines 12 are used to convey the first and second gaseous reactants, a first gas line may be operably connected to a source of the first gaseous reactant 16 and a second gas line may be operably connected to a source of the second gaseous reactant. Where a single gas line 12 is used to convey a mixture of the first and second gaseous reactants, the gas line 12 may be operably connected to both a source 16 of the first gaseous reactant and a source of the second gaseous reactant. The source 16 of each gaseous reactant may comprise a storage tank or gas canister.

In some embodiments, the source 16 of one or more of the gaseous reactants may comprise a system 30 for preparing the gaseous reactant. For instance, the embodiment illustrated in FIG. 2 comprises a system 30 for preparing tungsten hexachloride, which is then conveyed to the gas outlet 13 and employed as the metal-containing precursor in the deposition process. The system 30 comprises a chamber containing tungsten metal chips 31 and a source of chlorine gas 32. When operational, the system is configured such that the chlorine gas flows from the source 32 through the chamber containing tungsten metal chips 31 at an elevated temperature. As the chlorine gas contacts the tungsten chips at this elevated temperature, a reaction occurs and tungsten hexachloride gas is produced. Each of the one or more gas lines 12 may also be in fluid communication to a source of additional gaseous components, such as a carrier gas.

In order to control the flowrates of each of the first and second gaseous reactants, the system 10 also desirably comprises one or more flowmeters 17. For example, each gas source 16 may comprise a flowmeter 17 that is configured to provide for a controlled flow of the gas at a desired rate.

In some embodiments, one or more of gas lines 12 may also comprise a heating or cooling element 14. In some embodiments it may be necessary to maintain a gaseous reactant, such as the metal-containing precursor, at an elevated temperature prior to its reaction with the second gaseous reactant. Or it may simply be desirable to pre-heat one or more of the gas streams, such as in order to increase the speed with which the metal-producing reaction occurs. Alternatively, in some embodiments it may be desirable to cool one or more of the gas streams in order to prevent the first and second gaseous reactants from reacting within either a gas lines 12 or a gas outlet 13. Any conventional heating or cooling element 14 may be used to control the temperature of the gases flowing through the one or more gas lines 12. In the embodiment shown in FIG. 2, for example, the gas line 12 for the first gaseous reactant is shown surrounded by heating coils.

The one or more gas lines 12 comprise one or more gas outlets 13, the one or more gas outlets being configured to introduce the gaseous reactants into the vacuum chamber 11 and, more particularly, against the surface of the substrate 20. Accordingly, the one or more gas outlets 13 may comprise conventional elements for introducing gas from a gas line 12 into a chamber 11, and in particular against a substrate 20. For example, each of the one or more gas outlets 13 may comprise a nozzle, a manifold, or the like. For the same reasons described above with respect to the gas lines 12, embodiments of the one or more gas outlets 13 may also be outfitted with a heating or cooling unit.

Figure 2:
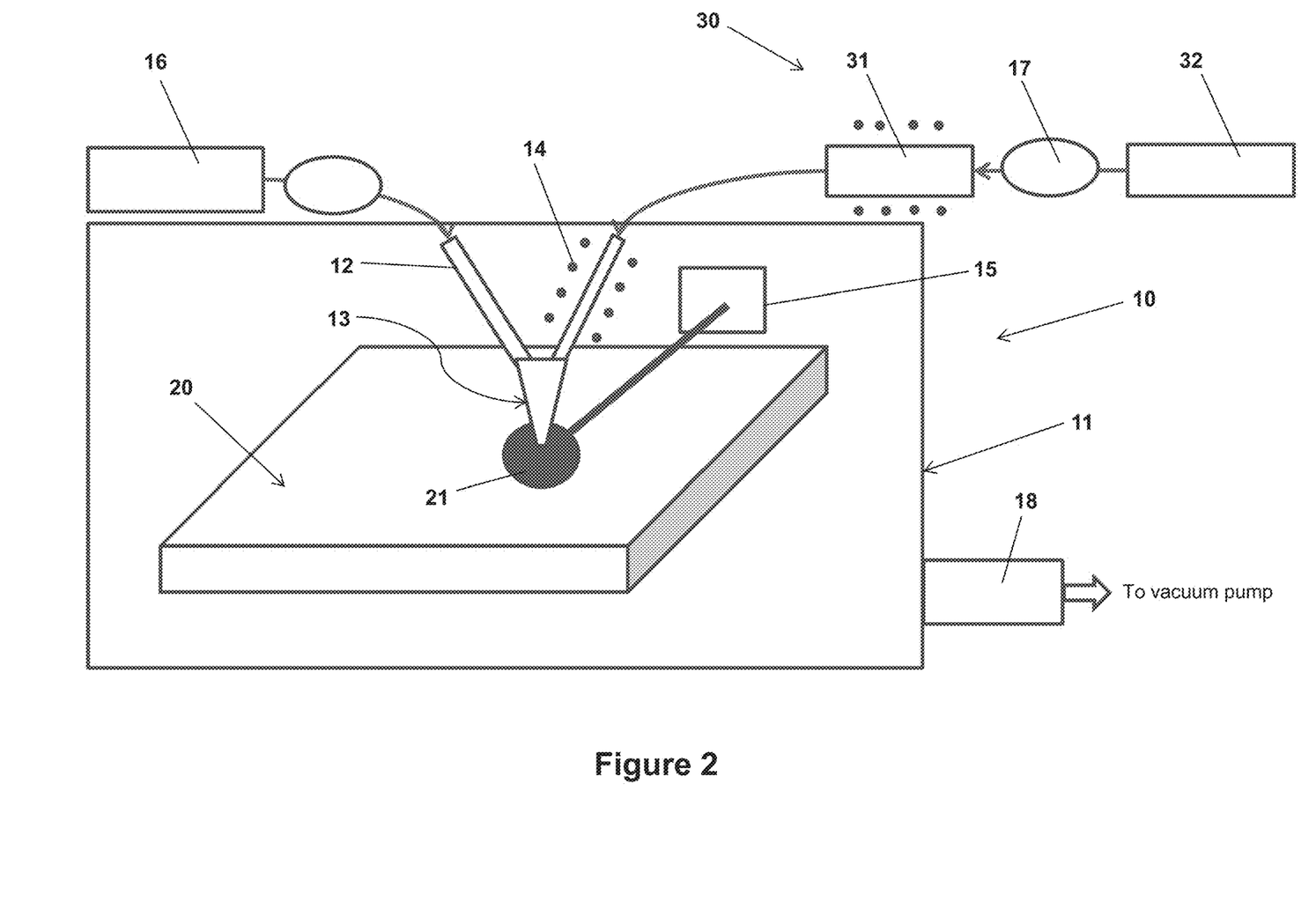
FIG. 2 is an illustration of a system for printing a metal layer on a substrate according to an embodiment of the present disclosure, which includes the preparation of the metal-containing precursor gas.

In some embodiments, the first and second gaseous reactants may be introduced to the surface of the substrate 20 through a single gas outlet 13, such as is shown in the embodiments illustrated in FIGS. 1 and 2. In order to provide a substantially consistent contact of the gaseous reaction mixture across a desired zone of the substrate 20 surface, the first and second gaseous reactants may be mixed just prior to reaching the gas outlet 13. Additionally, the gas outlet 13 may have a diameter that is similar to the diameter of the desired zone.

Figure 3:
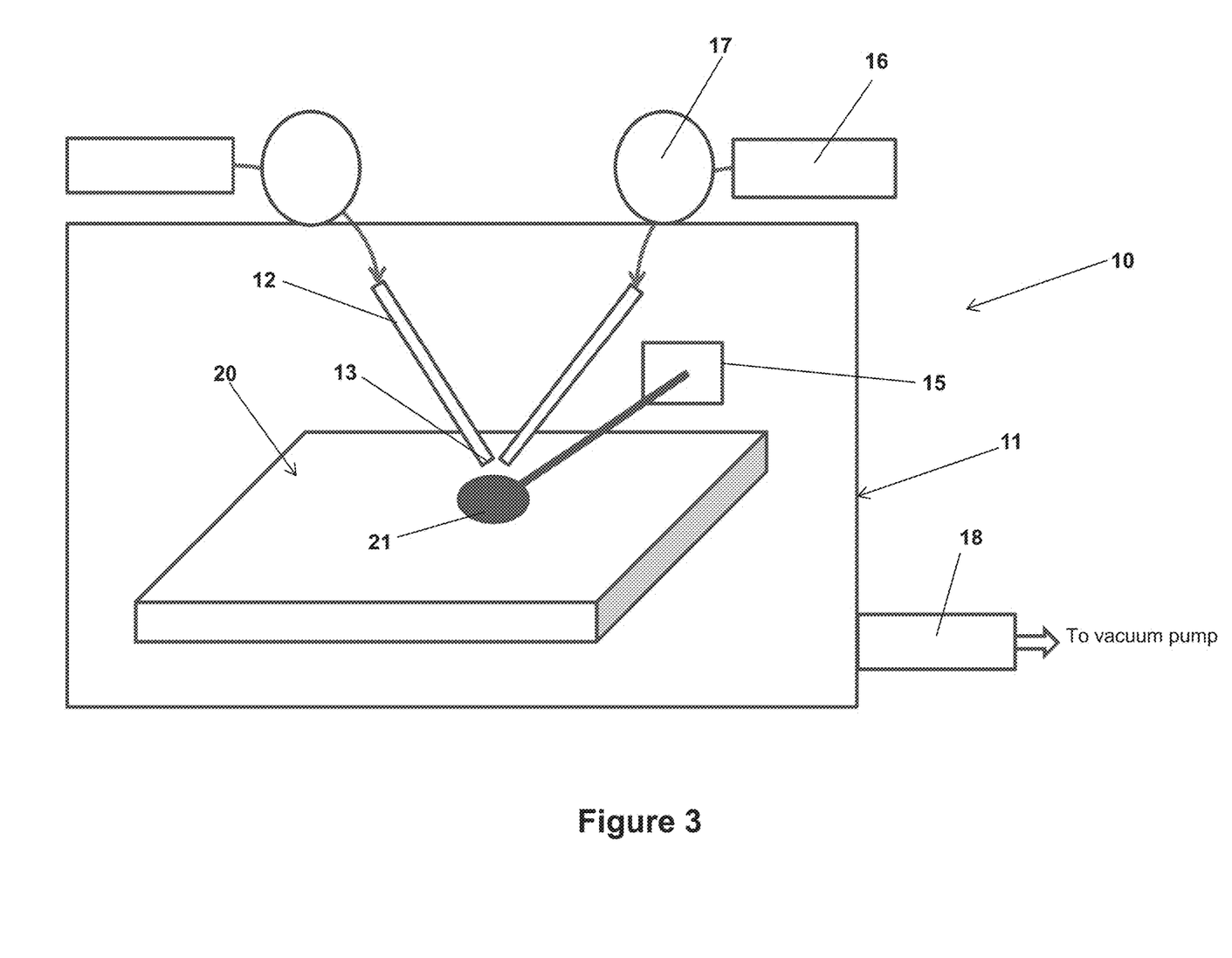
FIG. 3 is an illustration of a system for printing a metal layer on a substrate according to an embodiment of the present disclosure in which the reaction gases are introduced through separate gas outlets.

In other embodiments, the first and second gaseous reactants may be introduced through separate gas outlets 13, as is shown for example in the embodiment illustrated in FIG. 3. In order to provide a substantially consistent contact of the gaseous reaction mixture across a desired zone of the substrate 20 surface, the gas outlets 13 may be positioned to spray the gases at carefully controlled flowrates, at controlled angles relative to one another, and the like. For example, where the gas lines 12 are concentric, the outlet 13 of the outer gas line may be angled inward and the outlet of the inner gas line may be angled outward. The desired relative flowrates of the first and second gaseous reactants may also be taken into account in selecting the sizes and configuration of the separate gas outlets. In some embodiments, the separate gas outlets 13 for the first and second gaseous reactants may be alternated in order to produce a substantially consistent ratio of reactants across the desired reaction zone. For example, each separate gas outlet 13 may comprise a manifold, and the individual spouts of the separate manifolds may alternate with one another in order to provide for a consistent mixture of the gaseous reactants across the desired zone of the substrate 20. In some embodiments, the diameter of the combination of gas outlet 13 manifolds or nozzles may also be similar to the diameter of the desired zone.

When the system 10 is in use, the one or more gas outlets 13 are desirably located close to the surface of the substrate 20. For example, the one or more gas outlets 13 may be configured to be positioned less than 20 mm from the surface of the substrate 20, alternatively less than 15 mm from the surface, alternatively less than 12 mm from the surface, alternatively less than 10 mm from the surface. In some embodiments, the one or more gas outlets 13 may be moveable toward and away from the substrate surface 20 in order to obtain a desired working distance from the surface of the substrate 20. In other embodiments, the one or more gas outlets 13 may be fixed at a particular distance above the substrate 20 surface.

The system also comprises at least one laser 15. The laser 15 is positioned to direct its output against a location on the substrate surface 20 that is adjacent to the one or more gas outlets 13. As such, the laser 15 is configured to heat an area of a desired size, or zone 21, on the surface of the substrate 20. The laser 15 may be selected from any of the known laser types, such as those that are conventionally used in selective laser sintering (SLS) printing technologies. The type of laser, as well as the power of the laser, may be selected depending on the desired temperature to which the zone 21 on the substrate surface 20 is heated. It should be understood that the reference to a laser 15 or the laser in the present disclosure encompasses the use of one or more than one laser. In some embodiments, the laser 15 may be attached to the one or more gas lines 12 or gas outlets 13 such that the combination of the gas outlets and the laser may together be moved along the surface of a substrate 20 in a controlled and coordinated manner.

Each of the one or more gas outlets 13 and the laser 15 may be configured to travel along the surface of the substrate 20 in a controlled manner. By moving the one or more gas outlets 13 and the laser 15 along the substrate surface 20 during operation, one may deposit a metal layer in a desired pattern on the substrate surface. For instance, the one or more gas outlets 13 and the laser 15 may be configured to provide a coordinated movement along the substrate surface 20, such that the relationship between the one or more gas outlets 13 and the heated zone 21 of the substrate surface remains substantially the same throughout the movement. A coordinated movement of this sort may provide for the deposit of a consistent metal layer in a desired pattern. The movement of the one or more gas outlets 13 and the laser 15 may be computer controlled, such as in order to provide a precisely patterned metal layer. It is also contemplated that the one or more gas outlets 13 and the laser 15 may remain stationary during use and the substrate 20 may be controllably moved in a desired pattern in order to produce a patterned metal layer.

In some embodiments, the surface of the substrate 20 may comprise a pattern and the one or more gas outlets 13 and laser 15 may be configured to follow that pattern. For example, a photoresist, such as SU-8, may be used to provide a pattern on the surface of the substrate 20 using methods that are generally understood in the art. Other techniques for patterning and/or masking substrates, such as those that employ various types of polymers, treatments, etc., are generally known in the art. It is contemplated that any of these techniques could be applied in cooperation with the method and system disclosed herein without departing from the scope of the present disclosure.

The system 10 may also comprise one or more gas outlet scrubber units 18. In some applications, the reaction of the metal-containing precursor and the second gaseous reactant may produce a byproduct that is potentially dangerous to equipment, humans, the environment, etc. Accordingly, it may be desirable to filter the reaction gas and/or to contact the reaction gas with a neutralizing agent as it exits the vacuum chamber 11. For instance, where the reaction is between a halogenated metal precursor (e.g. $WF_6$ or $WCl_6$) and hydrogen gas, the reaction produces an acidic byproduct such as HF or HCl. The acidic byproduct can be neutralized by contacting the gas with an alkali compound as it exits the vacuum chamber. The embodiments illustrated in FIGS. 1-3, for example, each include a scrubber unit 18 in which the gases exiting the vacuum chamber 11 are contacted with an alkali compound. The alkali compound may be in a solid, liquid, or gas state. In some embodiments, it may be desirable to flow the outlet gas through an alkali liquid bath and/or to flow the gas through a packed bed of alkali salts.

Although the foregoing embodiments are described in terms of supplying first and second gaseous reactants, it should be understood that the above-described systems 10 may be configured to supply any number of gaseous reactants to the substrate surface 20. For instance, any number of additional gas lines 12, gas outlets 13, and the like may be employed in the system 10 without departing from the scope of the present disclosure.

Methods

Embodiments of the present disclosure are directed to methods for the localized deposition of a metal layer on a substrate. The method comprises introducing a first gaseous reactant and a second gaseous reactant to the surface of a substrate and, at the same time, directing laser energy against a location on the substrate surface in order to heat a zone of the surface such that a metal reaction product is deposited on the heated zone of the surface.

The first gaseous reactant comprises a metal-containing precursor gas. The metal-containing precursor gas may be any metal-containing compound that may be conveyed in the gas phase to the surface of the substrate and which may be reacted with a second gaseous reactant to produce metal crystal growth. In some embodiments, it may be possible to use a metal-containing precursor compound that is both gaseous and stable at relatively low temperatures, such as room temperature, so that first gaseous reactant may be conveyed to the substrate surface without the need for pre-heating. In other embodiments, the metal-containing precursor compound will need to be prepared and conveyed under elevated temperatures. The first gaseous reactant may also comprise one or more additional gaseous components, such as a carrier gas, one or more additional reactants, or the like.

In some embodiments, the metal layer being deposited may be a transition metal and the metal-containing precursor gas may therefore be a gaseous compound that contains a transition metal. For instance, in some embodiments, the metal-containing precursor gas may comprise tungsten, titanium, tantalum, niobium, chromium, molybdenum, iron, nickel, zirconium, rhenium, hafnium, or the like. In other embodiments, the metal layer being deposited may comprise a basic or semi-metal. Accordingly, in some embodiments the metal or semi-metal containing precursor gas may comprise aluminum, tin, boron, silicon, germanium, arsenic, or the like.

The second gaseous reactant comprises a compound that is capable of reacting with the metal-containing precursor gas to produce metal crystal growth. In some embodiments, for example, the second gaseous reactant may comprise hydrogen gas. At elevated temperature the hydrogen gas may react with the metal-containing precursor compound to produce a free metal, which may deposit on a heated surface. The second gaseous reactant may also comprise one or more additional gaseous components, such as a carrier gas, one or more additional reactants, or the like.

In some embodiments, for example, the first gaseous reactant comprises a metal-containing precursor compound having the formula $MX_n$, in which M is a transition metal; X is selected from the group consisting of fluorine (F) and chlorine (Cl), bromine (Br); and n is an integer selected from the group consisting of three, four, five, and six. For example, in some embodiments, the metal-containing precursor may be tungsten hexafluoride ($WF_6$) or tungsten hexachloride ($WCl_6$). In other embodiments, the metal-containing precursor may be molybdenum pentachloride ($MoCl_5$), tantalum pentachloride ($TaCl_5$), or titanium pentachloride ($TiCl_5$). Each of these compounds are capable of reacting with hydrogen ($H_2$) to form a free metal and an acidic byproduct. For example, the reaction of tungsten hexafluoride and hydrogen proceeds according to the following:

$$WF_6 + 3H_2 \rightarrow W + 6HF.$$

Similarly, the reaction of titanium pentachloride generally proceeds according to the following:

$$2TiCl_5 + 5H_2 \rightarrow 2Ti + 10HCl.$$

Each of the first and second gaseous reactants are introduced to a portion of a substrate surface that is heated using laser energy, i.e. a heated zone of the substrate surface. For example, a laser may be directed to a position on the substrate surface such that the laser energy contacts the substrate surface at a desired location. The laser parameters may be controlled so that the heat produced by the laser energy expands outwardly from the point of contact to produce a heated zone on the substrate surface having a desired size and/or configuration. The heat produced by the laser energy may also cause the first and second gaseous reactants to react, producing a metal, such as a free metal, that is deposited on the heated zone of the substrate surface to form a metal layer.

Each of the first and second gaseous reactants may be introduced to the surface of a substrate 20 through one or more gas outlets 13. In some embodiments, such as the embodiment illustrated in FIGS. 1 and 2, the first and second gaseous reactants may be mixed prior to being introduced to the surface of the substrate 20. One benefit of this approach is that mixing of the first and second gaseous reactants may be easily performed prior to the reactants reaching the substrate surface, in to obtain a consistent mixture of reactants at the heated reaction zone. This may provide for the deposit of a more consistent metal layer, i.e. one having a consistent thickness, a smooth surface, or desirably both. In other embodiments, such as the embodiment illustrated in FIG. 3, the first and second gaseous reactants may be supplied via separate gas outlets 13, such that they come into contact with one another for the first time in the vicinity of the substrate surface 20. One benefit of this approach is that it tends to prevent the first and second gaseous reactants from undergoing unwanted reaction in the gas lines 12 and/or gas outlets 13, which can lead to clogging and destruction of the process equipment.

To prepare a more consistent metal deposit, it may be desirable to introduce a mixture of the first and second gaseous reactants substantially evenly across the heated zone 21 of the substrate surface 20. For instance, in some embodiments, the one or more gas outlets may be configured to introduce the mixture of gases across substantially the entirety of the heated zone 21. This could be accomplished, for example, by using either a single gas outlet 13 having a gas flow area that is similar to the area of the heated zone 21 or a plurality of gas outlets which, taken together, have a gas flow area that is similar to the area of the heated zone. For example, the diameter of the gas outlet or outlets 13 may make up between about 80% and about 110% of the diameter of the heated zone, alternatively between about 70% and about 100%, alternatively between about 50% and about 99%, alternatively between about 50% and about 95%, alternatively between about 60% and about 99%, alternatively between about 70% and about 95%, alternatively between about 75% and about 99%, alternatively between about 80% and about 95%. In order to prevent unnecessary loss of reactants due to gas flow around the heated zone 21, it may generally be desirable to have a gas flow area of the gas outlet or outlets 13 that is less than the area of the heated zone. It is also believed that by ensuring that the gas flow area of the gas outlet or outlets 13 is less than the area of the heated zone 21, one may prepare a metal layer having a smoother surface than embodiments in which the gas flow area of the gas outlet or outlets is greater than the area of the heated zone 21. That said, it may still be desirable in some embodiments to utilize one or more gas outlets 13 in which the gas flow area is greater than the area of the heated zone 21.

In other embodiments, at least one of the one or more gas outlets 13 may include a nozzle, such as a nozzle that is specifically configured to introduce the reactants substantially evenly across the entirety of the heated zone 21. Careful control over the flowrates of the first and second gaseous reactants may also be used to provide for a substantially even mixture of gaseous reactants across the heated zone 21.

The distance between the one or more gas outlets 13 and the heated zone 21 of the substrate surface 20 may also be carefully controlled in order to provide for an efficient and controllable metal deposition. In general, it is desirable for the distance between the one or more gas outlets 13 and the heated zone 21 of the substrate surface 20 to be kept at a minimum in order to ensure that the first and second gaseous reactants make adequate contact with the heated surface, as opposed to simply flowing around the heated zone. In some instances, however, too close of a relationship between the gas outlets 13 and the heated zone 21 may result in a heating of the gas outlets 13 to a temperature at which metallic reactions products are deposited on the gas outlets, thereby clogging the gas outlets 13 and potentially destroying the process equipment. Accordingly the distance between the gas outlets 13 and the heated zone 21 should be maintained within a desirable working range. For example, in some embodiments the one or more gas outlets 13 may be between about 3 mm and about 20 mm above the substrate surface, alternatively between about 3 mm and about 10 mm, alternatively between about 5 mm and about 20 mm, alternatively between about 5 mm and about 10 mm.

In some embodiments, it may be desirable to pre-heat one or more of the gaseous reactants prior to introducing the gaseous reactants to the surface of the substrate 20. By increasing the temperature of the gaseous reactants prior to their contact with the heated zone 21 of the substrate surface 20, for example, one may ensure that the gaseous reactants are adequately heated to the desired reaction temperature that is necessary to cause a metal deposit and that the reaction and deposition of the metal occur quickly.

Since care should be taken to avoid having the gas lines 12 and/or the gas outlets 13 reach a temperature at which the reaction of the first and second gaseous reactants would result in the formation of a metal layer on the process equipment, in some embodiments it may be desirable to cool one or more of the gas lines 12 and/or the gas outlets 13. For instance, reflected heat from the heated zone 21 of the substrate surface 20 may result in a heating of the one or more gas outlets 13 to a temperature at which the metallic reaction product would form on the gas outlets 13. In such instances, it may be necessary for the one or more gas outlets 13 to comprise a cooling system or insulation. Because the gaseous reactants need a heated surface in order for a substantial deposit to occur, in some embodiments, the gaseous reactants may be preheated to a temperature at which reaction may occur and yet the surfaces of the process equipment, e.g. the gas lines 12 and/or gas outlets 13, may be cooled in order to prevent the metal reaction production from depositing on those surfaces.

The temperature to which the heated zone 21 of the substrate surface 20 must be brought in order to induce the formation of a desirable metal layer will depend on the specific reactants, as well as the other process parameters. In some embodiments, the zone 21 of the substrate surface 20 is heated to at least a temperature that is sufficient to cause the first and second gaseous reactants to react. For example, where tungsten hexafluoride is used as the metal-containing precursor and hydrogen is used as the second gaseous reactant, the reaction will occur at temperatures above about 300° C. Accordingly, in some embodiments, the zone 21 of the substrate surface 20 may be heated to a temperature of at least 300° C. Or, for example, where tungsten hexachloride is used as the metal-containing precursor and hydrogen is used as the second gaseous reactant, the reaction will occur at temperatures above about 500° C. Accordingly, in some embodiments, the substrate surface may be heated to a temperature of at least about 500° C. In some embodiments, such as where the gaseous reactants may already be preheated to a desired reaction temperature, the heated zone of the substrate may be brought to a temperature below the reaction temperature of the first and second gaseous reactants.

The exact temperature to which the surface is heated may be selected so as to provide a desired combination of metal growth rate and quality of the metal layer. As the temperature is increased, for example, the metal growth rate is increased, but the smoothness of the metal layer may decrease. Additionally, if the substrate surface 20 is heated above a certain upper bound temperature, the metal layer will not form at all. Accordingly, for example, where tungsten hexafluoride and hydrogen are reacted so as to deposit tungsten using the presently disclosed method, the temperature may generally be selected to be between about 300° C. and about 900° C., alternatively between about 400° C. and about 800° C. Or, for example, where tungsten hexachloride and hydrogen are reacted so as to deposit tungsten using the presently disclosed method, the temperature may generally be selected to be between about 500° C. and about 900° C., alternatively between about 600° C. and 800° C. However, it should be understood that the temperature to which the surface is heated may vary greatly depending on what metal is being deposited and what reaction is being used to deposit that metal. The above temperature ranges are provided as non-limiting examples.

In some instances, one or more of the reactants may have to be maintained at an elevated temperature prior to being introduced to the surface of the substrate 20. For example, in the embodiment illustrated in FIG. 2, a tungsten hexachloride gas, which is not stable at room temperature, is prepared immediately before its use in the deposition process. As such, the tungsten hexachloride gas is maintained at an elevated temperature as it is conveyed to the gas outlet 13. Specifically, as illustrated in FIG. 2, the tungsten hexachloride gas may be prepared by contacting tungsten metal chips with chlorine gas at an elevated temperature, such as above 600° C. Accordingly, in order to prevent the tungsten hexachloride gas from breaking down prior to being introduced to the surface of the substrate 20, the first gaseous reactant is heated as it conveyed to the gas outlet 13. Because the metal formed in the reaction will only deposit to a significant extent on a heated surface, the tungsten hexachloride gas and the hydrogen may be premixed at a temperature at which a reaction occurs so long as the equipment surfaces that the mixture comes into contact with prior to being introduced to the substrate surface are cool enough to avoid unwanted metal deposition. Alternatively, the tungsten hexachloride gas and the hydrogen may be introduced to the surface of the substrate through separate gas lines.

In some embodiments, the reaction between the first and second gaseous reactants may need to be performed under vacuum. Generally, a vacuum between about 25 Torr and about 0.001 Torr should be sufficient. In some embodiments, such as where the method is being used to prepare a single crystal metal, higher vacuum levels, such as those between about 5 Torr and about 0.001 Torr, may be necessary.

Additionally, in some embodiments, an acidic byproduct is produced by the reaction of the first and second gaseous reactants. For example, where a fluorinated metal compound is reduced by a reaction with hydrogen, the reaction produces a hydrofluoric acid byproduct. Similarly, where a chlorinated metal compound is reacted with hydrogen, the reaction products a hydrochloric acid byproduct. These acid gases are corrosive to process equipment and dangerous for workers and the environment. Accordingly, it may be desirable to contact the gases exiting the reaction chamber 11 with an alkaline element in order to neutralize the acidic byproducts. For instance, the gases exiting the reaction chamber may be directed through an alkali-containing liquid solution, such as an aqueous solution of NaOH or KOH. Alternatively (or in addition), the gases exiting the reaction chamber may be directed across solid alkali components.

The size of the heated zone 21 of the substrate surface 20, and hence the area of the surface on which the metal layer is formed, is determined by the size and power of the laser beam as well as the conductivity of the substrate. Accordingly, embodiments of the present disclosure provide a method by which one may prepare a metal layer in a controlled fashion over a very small portion of a surface. For example, in some embodiments, the laser may be controlled to provide a heated zone 21 having a diameter that is less than 10 mm, alternatively less than 8 mm, alternatively less than 6 mm, alternatively less than 5 mm, alternatively less than 4 mm, alternatively less than 3 mm, alternatively less than 2 mm, alternatively less than 1 mm.

For substrates that are highly conductive, one may wish to contact a smaller area of the substrate with the laser energy in order to limit the size of the heated zone 21 on which the metal will deposit. It also may be desirable to adjust the reaction parameters in order to increase the speed of the reaction and metal deposition, in order to limit undesired expansion of the heated zone, and the resulting metal layer. Additionally, if needed, insulation, such as coatings on the substrate surface or the use of other cooling elements, may be used to limit the effects of high substrate conductivity.

The thickness of the metal layer may be precisely controlled through control over the relevant reaction parameters, such as the temperature of the heated zone, the flowrate of the first and second gaseous reactants, and the length of time that the deposition is performed on the heated zone. For example, in some embodiments, the deposition may be performed to prepare a metal (or semi-metal) layer having a thickness in the nanometer scale (e.g. between about 1 nm and about 100 nm, alternatively between about 1 nm and about 50 nm, alternatively between about 1 nm and about 10 nm). In other embodiments, the deposition may be performed to prepare a metal (or semi-metal) layer having a thickness in the millimeter scale (e.g. between about 1 mm and about 100 mm, alternatively between about 1 mm and about 50 mm, alternatively between about 1 mm and about 10 mm). In some embodiments, the deposition may be performed to prepare a metal (or semi-metal) layer having a thickness between about 1 nanometer (nm) and about 5 millimeters (mm), alternatively between about 1 nm and about 3 mm, alternatively between about 1 nm and about 1 mm, alternatively between about 10 nm and about 5 mm, alternatively between about 10 nm and about 3 mm, alternatively between about 10 nm and about 1 mm.

Because the size and thickness of metal deposits may be precisely controlled using the presently disclosed method, embodiments of the presently disclosed method may be used as a mechanism for three-dimensional printing. For example, by repositioning the laser 15 one may change the location of the heated zone 21 on the surface of the substrate 20. The gas outlets 13 may also be repositioned, desirably in coordination with the repositioning of the heated zone 21, so that the first and second gaseous reactants remain in contact with the heated zone 21. In some embodiments, for instance, each of the laser 15 and the gas outlets 13 are moved in a controlled manner during operation so as to deposit the metal layer in a desired pattern on the substrate surface 20. It is also contemplated that the laser 15 and the gas outlets 13 may remain stationary and that the substrate 20 may be moved in a controlled manner during operation. In some embodiments, the surface of the substrate 20 may comprise a pattern, such as may be formed by a photoresist or polymer coating, which may assist in the controlled patterning of the metal deposit.

Embodiments of the presently disclosed method may be used, for example, for the printing of one or more electronic components on a substrate. For example, the method may be used for the printing of electronic components, such as gates, semiconductors, and the like on a silicon wafer. Accordingly, in some embodiments the substrate may be silicon, such as a silicon wafer. In other embodiments, the substrate may be metallic. Additionally, in some embodiments, the method may be utilized to prepare multiple layers of a single material or multiple layers of different materials on a substrate surface.

Embodiments of the presently disclosed method may also be used, for example, for the preparation of metals having any number of desired characteristics. In some embodiments, embodiments of the presently disclosed method may be performed to produce a monocrystalline metal. For example, one may select a substrate that has a similar crystal structure to the metal layer being formed. This may influence the metal crystal that forms as a result of the reaction between the first and second gaseous reactants to grow as a single crystal on the substrate surface. For example, by performing a carefully controlled deposition of tungsten on a monocrystalline molybdenum substrate (molybdenum having a similar crystal structure to tungsten), one may prepare a monocrystalline tungsten.

Embodiments of the presently disclosed method may also be used for the deposit of ceramic materials onto a substrate. For example, embodiments of the presently disclosed method may be configured to deposit $SiO_2$, $Al_2O_3$, or $SnO_2$. Embodiments of the presently disclosed method may also be used for the deposit of semiconductor materials onto a substrate. For example, embodiments of the presently disclosed method may be configured to deposit silicon, germanium, tin, silicon carbide, boron nitride, aluminum nitride, gallium nitride, zinc oxide, titanium dioxide, tin dioxide, nickel oxide, or the like. Similarly, embodiments of the presently disclosed method may also be configured to deposit semiconductor alloys, such as silicon-germanium alloy, silicon-tin alloys, and the like.

In some embodiments, the substrate may be removed after the metal layer is deposited, yielding a pure metal having a desired shape and/or desirable properties. The substrate may be removed using chemical processing, as would generally be understood by a person of ordinary skill in the art.

It can be seen that the described embodiments provide a unique and novel method and system that has a number of advantages over those in the art. While there is shown and described herein certain specific structures embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:
1. A method for the localized deposition of a metal layer comprising:
    (a) introducing
        a first gaseous reactant, the first gaseous reactant comprising a metal-containing precursor, and
        a second gaseous reactant
    to a surface of a substrate, wherein the first and second gaseous reactants are introduced to the surface of the substrate through one or more gas outlets; and

(b) directing a laser against a location on the substrate surface that is adjacent to the one or more gas outlets, thereby heating a zone of the surface to a temperature at which the first and second gaseous reactants react to produce a metal and an acidic byproduct, such that a metal layer is deposited on the heated zone of the substrate surface;

(c) moving the one or more gas outlets and the laser in a controlled manner so as to deposit the metal layer in a desired pattern on the substrate surface; and repeating (a), (b) and (c) to perform three-dimensional printing of a plurality of layers of the metal onto the substrate, in which the surface onto which at least one subsequent metal layer is deposited on a prior metal layer deposited by (a) and (b), each of the plurality of the layers comprising a corresponding pattern and the one or more gas outlets and the laser follow the pattern to deposit the corresponding layer, wherein the metal deposited on the surface of the substrate such that the metal layer can be separated from the substrate.

2. The method of claim 1, wherein the one or more gas outlets are configured to introduce a mixture of the first and second gaseous reactants substantially evenly across the heated zone of the surface.

3. The method of claim 1, wherein the first and second gaseous reactants are introduced through a single outlet, the diameter of the outlet being less than the diameter of the heated zone.

4. The method of claim 3, wherein the outlet has a diameter that is between about 50% and about 95% of the diameter of the heated zone.

5. The method of claim 1, in which the first gaseous reactant and the second gaseous reactant are introduced through separate gas outlets.

6. The method of claim 1, wherein the heated zone has a diameter that is less than 10 mm.

7. The method of claim 1, wherein the heated zone has a diameter that is less than 5 mm.

8. The method of claim 1, wherein the one or more gas outlets are positioned between about 3 mm and about 20 mm above the substrate surface.

9. The method of claim 8, wherein the one or more gas outlets are positioned between about 5 mm and about 10 mm above the substrate surface.

10. The method of claim 1, wherein the metal of the metal-containing precursor is a transition metal.

11. The method of claim 1, wherein the metal-containing precursor has the formula $MX_n$, in which:
M is a transition metal,
X is a halogen, and
n is an integer selected from the group consisting of 5 and 6;
and the second gaseous reactant is $H_2$.

12. The method of claim 11, in which the transition metal is selected from the group consisting of tungsten (W), molybdenum (Mo), tantalum (Ta), titanium (Ti), rhenium (Re), niobium (Nb), nickel (Ni), and hafnium (Ht); and the halogen is selected from the group consisting of fluorine, chlorine, and bromine.

13. The method of claim 11, in which the metal-containing precursor is selected from the group consisting of tungsten hexafluoride and tungsten hexachloride.

14. The method of claim 1, wherein the deposited metal layers are monocrystalline.

15. The method of claim 14, wherein the deposited metal layers are monocrystalline tungsten.

16. The method of claim 1, in which the substrate is a silicon wafer.

17. The method of claim 1, further comprising cooling, with a cooling system, at least one of:
a gas outlet through which at least one of the first gaseous reactant or the second gaseous reactant are introduced; or
a gas line through which at least one of the first gaseous reactant or the second gaseous reactant are delivered to the gas outlet.

18. The method of claim 1, wherein the surface of the substrate is heated to a temperature of at least 300 degrees Celsius.

19. A method for the localized deposition of a metal layer comprising:
(a) introducing
a first gaseous reactant, the first gaseous reactant comprising a metal-containing precursor, and
a second gaseous reactant
to a surface of a substrate, wherein the first and second gaseous reactants are introduced to the surface of the substrate through one or more gas outlets; and
(b) directing a laser against a location on the substrate surface that is adjacent to the one or more gas outlets, thereby heating a zone of the surface to a temperature at which the first and second gaseous reactants react, such that a metal layer is deposited on the heated zone of the substrate surface, wherein the metal deposited on the surface of the substrate such that the metal layer can be separated from the substrate.

20. The method of claim 19, further comprising cooling, with a cooling system, at least one of:
a gas outlet through which at least one of the first gaseous reactant or the second gaseous reactant are introduced; or
a gas line through which at least one of the first gaseous reactant or the second gaseous reactant are delivered to the gas outlet.

* * * * *